US012648456B2

(12) United States Patent
Wang et al.

(10) Patent No.: US 12,648,456 B2
(45) Date of Patent: Jun. 2, 2026

(54) SEMICONDUCTOR PACKAGE HAVING AN EMBEDDED ELECTRICAL CONDUCTOR CONNECTED BETWEEN PINS OF A SEMICONDUCTOR DIE AND A FURTHER DEVICE

(71) Applicant: Infineon Technologies AG, Neubiberg (DE)

(72) Inventors: Lee Shuang Wang, Bukit Baru (MY); Marta Alomar Dominguez, Nötsch im Gailtal (AT); Marcus Böhm, Mintraching (DE); Edward Fürgut, Dasing (DE); Chii Shang Hong, Bukit Katil (MY); Teck Sim Lee, Melaka (MY); Bernd Schmoelzer, Radenthein (AT)

(73) Assignee: Infineon Technologies AG, Neubiberg (DE)

( * ) Notice: Subject to any disclaimer, the term of this patent is extended or adjusted under 35 U.S.C. 154(b) by 459 days.

(21) Appl. No.: 18/195,178

(22) Filed: May 9, 2023

(65) Prior Publication Data

US 2023/0361009 A1     Nov. 9, 2023

(30) Foreign Application Priority Data

May 9, 2022     (DE) ...................... 10 2022 111 517.8

(51) Int. Cl.
H01L 23/495 (2006.01)
H01L 23/00 (2006.01)
(Continued)

(52) U.S. Cl.
CPC .... H01L 23/49562 (2013.01); H01L 23/3157 (2013.01); H01L 23/49503 (2013.01);
(Continued)

(58) Field of Classification Search
CPC ..................... H01L 23/49541; H01L 23/49562
(Continued)

(56) References Cited

U.S. PATENT DOCUMENTS 5,049,973 A * 9/1991 Satriano ................. H01L 24/06
257/E23.044
6,919,643 B2 7/2005 Wheeler et al.
(Continued)

FOREIGN PATENT DOCUMENTS

DE          602 14 894          4/2007
DE     10 2018 112 477          11/2018
EP          3 176 822           6/2017

*Primary Examiner* — Quoc D Hoang
(74) *Attorney, Agent, or Firm* — Dicke, Billig & Czaja, PLLC

(57) ABSTRACT

A semiconductor package is disclosed. In one example, the semiconductor package comprises a package body and a second die pad at least partially encapsulated in the package body. A first semiconductor die is at least partially encapsulated in the package body and arranged on the first die pad. A further device at least partially encapsulated in the package body and arranged on the second die pad. At least one first lead is connected with the first contact pad of the first semiconductor die. At least one second lead is connected with the second contact pad of the further device. An electrical conductor is connected between the at least one first lead and the at least one second lead, the electrical conductor being completely encapsulated in the package body.

17 Claims, 5 Drawing Sheets

(51) Int. Cl.
*H01L 23/31* (2006.01)
*H01L 25/07* (2006.01)

(52) U.S. Cl.
CPC ........ *H01L 23/49575* (2013.01); *H01L 24/40* (2013.01); *H01L 25/072* (2013.01); *H01L 2224/40175* (2013.01)

(58) Field of Classification Search
USPC ........................................................ 257/676
See application file for complete search history.

(56) References Cited

U.S. PATENT DOCUMENTS

| | | | |
|---|---|---|---|
| 9,978,672 B1 | 5/2018 | Ahlers et al. | |
| 2005/0151236 A1* | 7/2005 | Oliver | H01L 23/49575 |
| | | | 257/E23.044 |
| 2017/0155391 A1 | 6/2017 | Kinzer et al. | |
| 2019/0080992 A1 | 3/2019 | Joos et al. | |
| 2022/0020669 A1 | 1/2022 | Mcknight-Macneil et al. | |

* cited by examiner

1

SEMICONDUCTOR PACKAGE HAVING AN EMBEDDED ELECTRICAL CONDUCTOR CONNECTED BETWEEN PINS OF A SEMICONDUCTOR DIE AND A FURTHER DEVICE

CROSS-REFERENCE TO RELATED APPLICATION

This Utility Patent application claims priority to German Patent Application No. 10 2022 111 517.8 filed May 9, 2022, which is incorporated herein by reference.

TECHNICAL FIELD

The present disclosure is related to a semiconductor package and a leadframe.

BACKGROUND

Inverter power modules have transitioned from a niche market solution to a commodity product in power electronics and especially in the field of renewable energies. Borrowing module and packaging concepts from pre-existing products with high maturity in the product life cycle is plausible if the inverter power module complexity stays small. Without any adaptions, implementing even a simple half bridge with two power switch devices in a single package eliminates the use of established production-efficient designs, resulting in limitations of several requirements such as power and temperature ratings, switching symmetry, routing capability of signals, etc.

For realization of a half bridge using a conventional leadframe concept involves molding two single power switch devices, each having a copper substrate often called a die pad or paddle, and the corresponding driver chips (dies) and power and signal pins next to each other. The power switch devices are connected at a phase node with different methods. For example, the phase connection can be provided by an interconnect crossing-over between the high-side and the low-side switch, e.g. by a copper clip on the chip front side which results in high chip cost due to the necessity of solderable frontside metallizations. In another case, the phase connection is done by external routing on the customer side by providing an electrical connection within a printed circuit board by which the pins associated with the two power switch devices are electrically connected together. This configuration allows lowering the inductance at application level or even at system level.

For these and other reasons there is a need for the present disclosure.

SUMMARY

A first aspect of the present disclosure is related to a semiconductor package comprising a package body, a first die pad at least partially encapsulated in the package body, the first die pad comprising a first main face and a second main face opposite to the first main face, a second die pad at least partially encapsulated in the package body, the second die pad comprising a first main face and a second main face opposite to the first main face, a first semiconductor die at least partially encapsulated in the package body and arranged on the first die pad, the first semiconductor die comprising a first contact pad disposed on the first main face of the first semiconductor die and a second contact pad disposed on the second main face of the first semiconductor die, wherein the first semiconductor die is connected with the second contact pad to the first die pad, a further device at least partially encapsulated in the package body and arranged on the second die pad, the further device comprising a first contact pad disposed on the first main face of the further device and a second contact pad disposed on the second main face of the further device, wherein the further device is connected with the second contact pad to the second die pad, at least one first lead connected with the first contact pad of the first semiconductor die and extending out of the package body, at least one second lead connected with the second contact pad of the further device and extending out of the package body, and an electrical conductor connected between the at least one first lead and the at least one second lead, the electrical conductor being completely encapsulated in the package body.

A second aspect of the present disclosure is related to a leadframe, comprising a first die pad comprising a first main face and a second main face opposite to the first main face, a second die pad comprising a first main face and a second main face opposite to the first main face, at least one first lead, at least one second lead, and an electrical conductor connected between the at least one first lead and the at least one second lead. In a further aspect, the first lead and the second lead respectively have a near end closing to the first die pad and the second die pad respectively and a far end away from the first die pad and the second die pad respectively, and the electrical conductor is configured perpendicular to the first lead and the second lead and close to the near end of the first lead and the second lead. So that after molding the lead frame into a semiconductor package, this conductor will not be exposed from the sidewall of the semiconductor package. In a further aspect, the electrical conductor is in a plane different from the plane of the first die pad the second die pad, so that after molding this lead frame into a semiconductor package, this electrical conductor can be fully embedded into the mold compound.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

Figure 1:
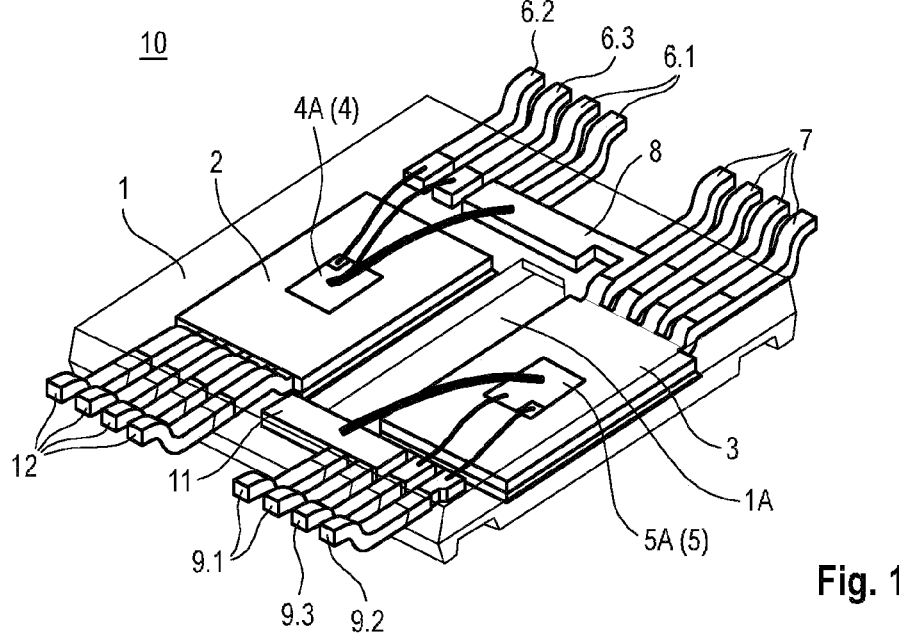
FIG. 1 shows a perspective view on a semiconductor package comprising two semiconductor transistor dies forming a half bridge circuit, both dies arranged in a drain down configuration.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together: intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A: X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

FIG. 1 shows a perspective view on a semiconductor package comprising two semiconductor transistor dies forming a half bridge circuit according to a first embodiment.

More specifically, FIG. 1 shows a semiconductor package 10 comprising a package body 1, a first die pad 2 at least partially encapsulated in the package body 1, the first die pad 2 comprising a first main face and a second main face opposite to the first main face. In the embodiment as depicted in FIG. 1 the first main face is the upper main face, and the second main face is the lower main face of the first die pad 2. The semiconductor package 10 further comprises a second die pad 3 at least partially encapsulated in the package body 1, the second die pad 3 comprising a first main face and a second main face opposite to the first main face. In the embodiment as depicted in FIG. 1 the first main face is the upper main face, and the second main face is the lower main face of the second die pad 3.

The semiconductor package 10 further comprises a first semiconductor die 4 encapsulated in the package body 1 and arranged on the first die pad 2, the first semiconductor die 4 comprising a source pad 4A disposed on the first main face of the first semiconductor die 4 and a drain pad (not to be seen) disposed on the second main face of the first semiconductor die 4, wherein the first semiconductor die 4 is connected with the drain pad to the first die pad 2, i.e., the die 4 is a so-called source up die or drain down die.

The semiconductor package 10 further comprises a second semiconductor die 5 encapsulated in the package body 1 and arranged on the second die pad 3, the second semiconductor die 5 comprising a source pad 5A disposed on the first main face of the second semiconductor die 5 and a drain pad (not to be seen) disposed on the second main face of the second semiconductor die 5, wherein the second semiconductor die 5 is connected with the drain pad to the second die pad 3.

The semiconductor package 10 further comprises a plurality of first leads 6 and a plurality of second leads 7. Both the first leads 6 and the second leads 7 comprise inner embedded portions which are usually called lead fingers. The lead fingers have been optionally refined by special coatings compared to the external portions of the leads and thus have improved conductivity properties compared to the external portions. An electrical conductor 8 is connected between lead fingers of two leads 6.1 of the plurality of first leads 6 and one lead finger of one of the plurality of second leads 7.

A thick bond wire is connected between the source pad 4A and the electrical connector 8 and hence also with the two lead fingers of the two leads 6.1 of the first plurality of leads 6. The four leads 7 of the second plurality of second leads 7 are all connected with the drain pad of the second semiconductor die 5 and the electrical connector 8 is connected with all lead fingers of the second leads 7. The electrical conductor 8 is completely encapsulated in the package body 1. The skilled person should understand that the thick bond wire can be replaced by clip or ribbon or other suitable bonding means. In a further embodiment, the leads 7 are physically extended from the second die pad 3, i.e., the leads 7 and the die pad 3 are made from a single piece of metal. So that the resistance and/or inductance from the leads 7 to the die pad 3 are greatly reduced. In a further embodiment, the electrical connector 8, the leads 7 and the die pad 3 are made from a single piece of metal, so that the resistance and/or inductance from the source lead 6 to the upper surface of the 2nd die pad 3 is greatly reduced. Therefore the inductance from the source pad 4A of the first die to the drain pad of the second die is greatly reduced.

The semiconductor package 10 according to the embodiment of FIG. 1 further comprises a leadframe, wherein the first die pad 2, the second die pad 3, the at least one first lead 6, the at least one second lead 7, and the electrical connector 8 are part of the leadframe.

The plurality of first leads 6 also comprises a lead 6.2 which is connected by a bond wire to the gate pad of the first semiconductor die 4 and an optional lead 6.3 which is connected by a bond wire to an optional source sense pad of the first semiconductor die 4.

Only part of the leads 6 of the first plurality of leads 6, namely the source leads 6.1 are connected with the electrical connector 8 whereas all leads 7 of the second plurality of leads 7 are drain leads so that preferably all these leads 7 should be connected with the electrical connector 8.

The semiconductor package 10 further comprises a third plurality of leads 12 which are all connected with the drain pad of the first semiconductor die 4. And the semiconductor package 10 further comprises a fourth plurality of leads 9 which comprises leads 9.1 which are connected with a metallic bar (lead finger) 11 which is connected by a thick bond wire with the source pad 5A of the second semiconductor die 5. The fourth plurality of leads 9 further comprises a lead 9.2 which is connected by a bond wire with the gate pad of the second semiconductor die 5, and a lead 9.3 which is connected by a bond wire with the source sense pad of the second semiconductor die 5. A skilled person should understand the so-called "metallic bar 11" can be in different shape, meaning not necessary to be longer toward from the second die pad 3 to the first die pad 2, as shown in FIG. 1 It is also possible a so-called "fused lead", which means there is a lead pad connecting all the source lead, the bonding wire/clip can land on the fused lead. It is also possible that the plurality of source leads are separated from each other, so that the clip connects the source pad of the second die to all the source leads 9.1.

According to the embodiment of the semiconductor package 10 of FIG. 1 each of the first semiconductor die 4 and the second semiconductor die 5 comprises a semiconductor transistor, in particular a power semiconductor transistor, wherein the first contact pad 4A of the first semiconductor die 4 is a source pad 4A, and the second contact pad of the first semiconductor die 4 is a drain pad, and the second contact pad 5A of the second semiconductor die 5 is a source pad 5A, and the second contact pad of the second semiconductor die 5 is a drain pad.

Furthermore the first semiconductor die 4 may comprise a first power transistor forming a high side switch of a half bridge circuit, and the second semiconductor die 5 may comprise a second power transistor connected in series with the first power transistor 4 and forming a low side switch of the half bridge circuit.

In general, semiconductor dies as described herein may be manufactured from an elemental semiconductor material (e.g. Si) or from a wide band gap semiconductor material or a compound semiconductor material (e.g. SiC, GaN, SiGe, GaAs) and could be incorporated into electronic devices such as an IGBT, an SFET, a CoolMOS or a diode. In particular, as already mentioned each of the semiconductor dies arranged on the first die pad 2 and the second die pad 3 may include or may correspond to a power semiconductor component and may thus be referred to as power semiconductor die. Here, the term "power semiconductor die" may refer to a semiconductor die providing at least one of high voltage blocking or high current-carrying capabilities. A power semiconductor die may be configured for high currents having a maximum current value of a few Amperes, such as e.g. 10 A, or a maximum current value of up to or exceeding 1000 A. Similarly, voltages associated with such current values may have values of a few Volts to a few tens or hundreds or even thousands of Volts.

In the present case, the power semiconductor dies may particularly be used in half bridge configurations and/or boost configurations, such as e.g. buck-boost-converters or boost converters. The configurations may be used for industrial grade products applied in one or more of integrated servo motor inverters or PFC (Power Factor Correction) Boost stages, for example. Addressed applications may include automotive applications, industrial drive applications, EV (Electric Vehicle) charging, etc. Exemplary circuits configured to be implemented in a semiconductor package in accordance with the present disclosure are shown and described in connection with FIGS. 4 to 11.

The package body 1 may be manufactured from a material including at least one of a mold compound, an epoxy, a filled epoxy, a glass fiber filled epoxy, an imide, a thermoplast, a thermoset polymer, a polymer blend, a laminate, etc. Various techniques may be used for encapsulating the components of the arrangement in the package body 2, for example at least one of transfer molding, injection molding, powder molding, liquid molding, map molding, laminating, etc. In a non-limiting example, a mold compound forming the package body 1 may have a CTI (Comparative Tracking Index) value of greater than about 600 V.

A significant advantage of the present disclosure is the fact that the electrical connection between the terminals of the two semiconductor dies is already made in the semiconductor package. It therefore does not have to be carried out on the customer's side, i.e. in the customer's substrate such as a PCB. The customer thus gains a degree of freedom to use an upper section of the PCB for other purposes, such as providing a cooling device therein. Another advantage is that since the connection between the low side switch and the high side switch is achieved within inside the package and further achieved via a wider internal metal bar, the resistance and/or inductance between the high side switch and the low side switch is greatly reduced, comparing achieved via the external connection on PCB.

The first and second semiconductor transistor dies 4 and 5 may each further comprise a respective gate pad on their respective first main faces. The semiconductor package 10 may then further comprise at least one gate driver device disposed on one or both of the leads 6.2 or 9.2, namely those leads which are connected by bond wires with the respective gate pads. The semiconductor package may in particular comprise two gate driver devices for the two semiconductor transistor dies 4 and 5, one of them disposed on a lead 6.2 of the first plurality of leads and the other one disposed on a lead 9.2 of the third plurality of leads. These gate driver devices may also be embedded within the package body 1.

It should further be mentioned that the package body 1 comprises a groove 1A formed into an upper surface of the package body 1 between the first die 2 and the second die 3. The groove 1A serves the purpose to reduce or in the best case avoid harmful creepage currents between the first and second semiconductor dies 4 and 5 by increasing a creepage distance between them.

Also other kinds of semiconductor dies can be used as the first and second semiconductor dies and also more than two semiconductor dies can be implemented in the semiconductor package as will be presented in the following.

Figure 2:
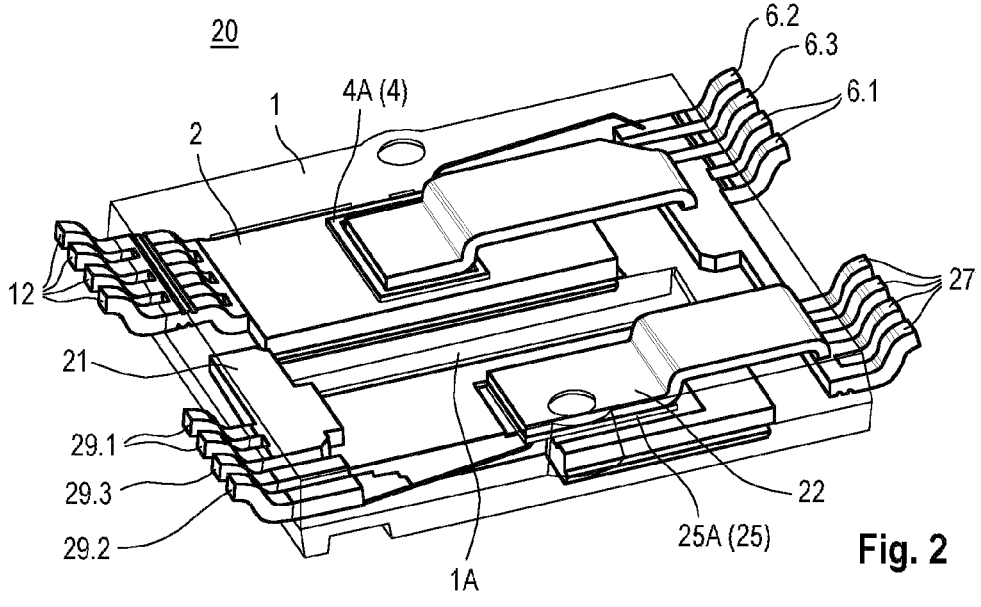
FIG. 2 shows a perspective view on an unpackaged semiconductor package comprising two semiconductor transistor dies forming a half bridge circuit, one of the dies arranged in a drain down configuration and the other one arranged in a source down configuration.

FIG. 2 shows a perspective view on an unpackaged semiconductor package comprising two semiconductor transistor dies forming a half bridge circuit according to a second embodiment, wherein one of the dies arranged in a drain down configuration and the other one arranged in a source down configuration.

More specifically, FIG. 2 depicts a semiconductor package 20 which is similar to the semiconductor package 10 of FIG. 1 so that most of the reference signs of FIG. 1 were adopted and with regard to the function of the corresponding elements, reference is made to the above description. In particular, the first semiconductor die 4 is arranged in a drain down configuration as in FIG. 1.

An amendment as compared to FIG. 1 is that the second semiconductor die 25 is configured in a source down configuration. Accordingly the drain pad 25A of the second semiconductor die 25 is disposed on an upper surface thereof and the leads 27 of a third plurality of leads are all connected with a clip 22 which is connected to the drain pad 25A. The source pad, the gate pad, and the source sense pad are disposed on a lower surface of the semiconductor die 25 and are not to be seen in the representation of FIG. 2. The semiconductor package 10 further comprises a fourth plurality of leads 29 which comprises leads 29.1 which are connected with an metallic bar 21 (lead finger) which is connected by an interconnect, e.g. copper clip or thick bond wire (not to be seen) with the source pad of the second semiconductor die 25. The fourth plurality of leads 29 further comprises a lead 29.2 which is connected by a bond wire with the gate pad of the second semiconductor die 25, and a lead 29.3 which is connected by a bond wire with the source sense pad of the second semiconductor die 25. In this combined configuration of a source-up die and a source-down die, [JM(LP1] the drain leads 27 do not physically connect to the second die pad, which the second die 25 is attached on, and the electrical connector 8 connects the source leads 6.1 of the high side switch and the drain leads 27 of the low side switch, can be implemented similar to the electrical connector 8 in some embodiments of FIG. 1.

Figure 3:
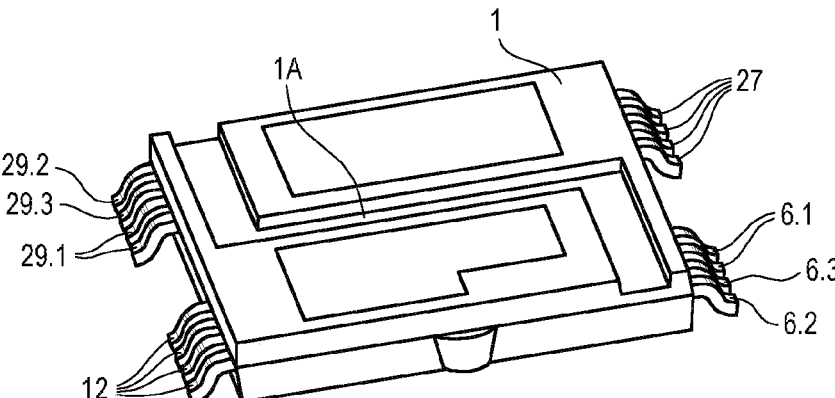
FIG. 3 shows a perspective view on the semiconductor package of FIG. 2 in a packaged configuration.

FIG. 3 shows a perspective view on the semiconductor package of FIG. 2 in a packaged configuration. FIG. 3 thus shows the package body 1, which was only shown in outline in FIG. 2.

Furthermore, a third embodiment is possible in which both the first and second semiconductor dies use source-down configuration, i.e., the source terminals of the two dies directly contact the two die pads, and the source terminal of the high side switch connects to the source leads which actually physically extended from the die pad, then the internal electrical conductor/bridge physically connects at least one source leads to the at least one drain lead of the low-side switch, and there wires or a clip or another connection connect the drain leads to the drain terminal of the second die (source-down die), and the source terminal of the second die physically connects to the die pad and which further physically connects to the source leads of the low-side switch.

Furthermore, a fourth configuration is possible in which a source-down configuration is used for the first semiconductor die, i.e. the high-side switch and a drain-down configuration is used for the second semiconductor die, i.e. the low-side switch. For example, the source terminal of the first semiconductor die is directly disposed on the first die pad, which physically connects to the source leads. The drain leads can electrically connect to the drain terminal of the first semiconductor die by a clip or wires or any other connection. Then the internal electrical conductor/bridge physically connects the source lead of the high-side switch to at least one drain lead of the low-side switch, where the drain leads are actually physical extension of the second semiconductor die pad. For the second semiconductor die, its source terminal faces up, and connects to the source leads of the low-side switch by a clip or wires or others means.

Figure 4A:
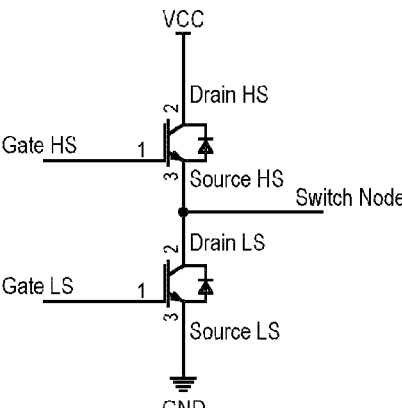
FIG. 4 comprises FIGS. 4A and 4B and shows schematic circuit diagrams of a half bridge circuit of two transistors (A) and a boost circuit of a transistor and a diode (B).
Figure 4B:
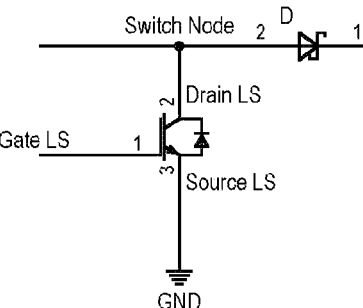

FIG. 4 comprises FIGS. 4A and 4B and shows schematic circuit diagrams of a half bridge circuit of two transistors (A) and a boost circuit of two transistors (B).

FIG. 4A shows a schematic circuit diagram of a half bridge circuit of two semiconductor transistors. A first semiconductor transistor functioning as high side (HS) switch is connected between a voltage source VCC and a switch node and a second semiconductor transistor functioning as low side (LS) switch is connected between switch node and ground. The different possible configurations as regards source down and drain down of the first and second transistors were described above in connection with FIGS. 1 to 3.

In the following further embodiments will be shown and described. It will become clear that embodiments are possible in which instead of the second semiconductor die of the embodiments of FIGS. 1 to 3 other electronic or electrical devices can be used and connected with the first semiconductor die. These devices could, for example, be devices like semiconductor diodes, capacitors, resistors, or RC elements.

FIG. 4B shows a schematic circuit diagram of a boost circuit of a semiconductor transistor and a semiconductor diode. A semiconductor transistor is coupled with its source to ground and with its drain to a switch node and the switch node is coupled between a semiconductor diode and the semiconductor transistor.

Figure 5A:
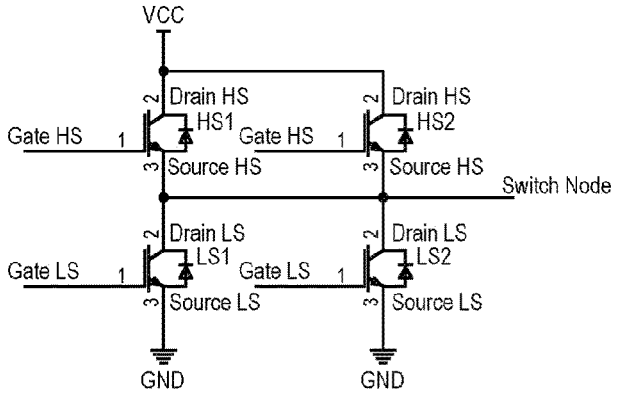
FIG. 5 comprises FIGS. 5A and 5B and shows schematic circuit diagrams of an interleaved half bridge circuit (A) and an interleaved boost circuit (B).
Figure 5B:
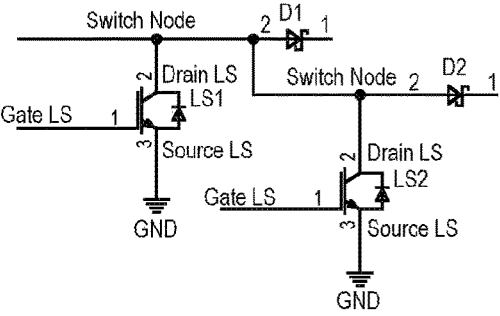

FIG. 5 comprises FIGS. 5A and 5B and shows schematic circuit diagrams of an interleaved half bridge circuit (A) and an interleaved boost circuit (B).

FIG. 5A shows a schematic circuit diagram of an interleaved half bridge circuit comprising four semiconductor transistors. A first semiconductor transistor is connected between a voltage source VCC and a first switch node, and a second semiconductor transistor is connected between the first switch node and ground. A third semiconductor transistor is connected between the voltage source VCC and a second switch node which is connected with the first switch node, and a fourth semiconductor transistor is connected between the second switch node and ground.

FIG. 5B shows a schematic circuit diagram of an interleaved boost circuit comprising two semiconductor transistors and two semiconductor diodes. A first semiconductor transistor is connected between a first switch node and ground, the first switch node is connected a first semiconductor diode and the first semiconductor transistor, a second semiconductor transistor is connected between a second switch node which is connected with the first switch node and ground, and the second switch node is connected between a second semiconductor diode and the second semiconductor transistor. An embodiment of the circuit of FIG. 5B can be implemented by utilizing the internal electrical connectors/conductors/bridges similar to those in some embodiments of FIGS. 1~3, e.g., an electrical connector internally connects the drain leads of the first transistor and the anode of the first diode D1, and another electrical connector internally connects the drain leads of the second transistor and the anode of the second diode D2, and all these electrical connectors are embedded inside the semiconductor package.

Figure 6A:
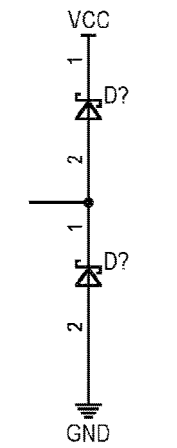
FIG. 6 comprises FIGS. 6A and 6B and shows schematic circuit diagrams of a half bridge circuit of two diodes (A) and a boost circuit of two diodes (B).
Figure 6B:
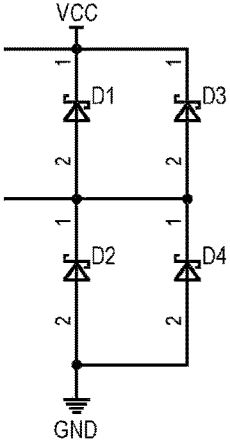

FIG. 6 comprises FIGS. 6A and 6B and shows schematic circuit diagrams of a half bridge circuit of two diodes (A) and a boost circuit of two diodes (B).

FIG. 6A shows a schematic circuit diagram comprising two semiconductor diodes. A first semiconductor diode is connected with its cathode terminal to a voltage source VCC and with its anode terminal to a switch node, and a second semiconductor diode is connected with its cathode terminal to the switch node and with its anode terminal to ground.

FIG. 6B shows a schematic circuit diagram comprising four semiconductor diodes. A first semiconductor diode is connected with its cathode terminal to a voltage source VCC and with its anode terminal to a first switch node, a second semiconductor diode is connected with its cathode terminal to the first switch node and with its anode terminal to ground, a third semiconductor diode is connected with its cathode terminal to the voltage source VCC and with its anode terminal to a second switch node which is connected with the first switch node, and a fourth semiconductor diode is connected with its cathode terminal to the second switch node and with its anode terminal to ground. Similarly, in the embodiments of FIGS. 6A and 6B, similar internal electrical connector(s) can be used to directly connect anode terminal of one diode to cathode terminal of another diode or two cathode terminals of two parallel diodes, etc.

Figure 7:
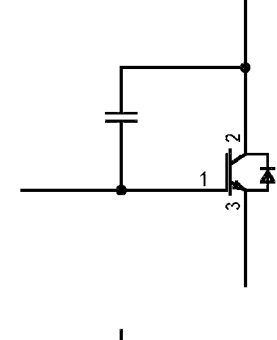
FIG. 7 shows a schematic circuit diagram of a circuit comprising a semiconductor transistor connected with a capacitor in a so-called Miller capacitor configuration.

FIG. 7 shows a schematic circuit diagram of a circuit comprising a semiconductor transistor connected with a capacitor in a so-called Miller capacitor configuration. Here a semiconductor transistor is coupled with its drain to a first terminal of a Miller capacitor and with its gate to a second terminal of the Miller capacitor. Furthermore a semiconductor diode is connected in parallel to the semiconductor transistor.

Figure 8:
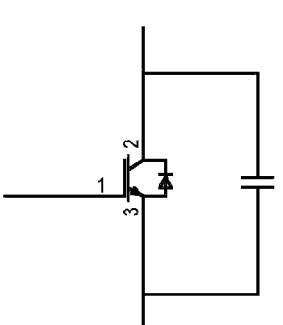
FIG. 8 shows a schematic circuit diagram of a circuit comprising a semiconductor transistor and a capacitor connected between source and drain.

FIG. 8 shows a schematic circuit diagram of a circuit comprising a semiconductor transistor and a capacitor connected between source and drain. Here a semiconductor transistor is coupled with its drain to a first terminal of a capacitor and with its source to a second terminal of the capacitor.

Figure 9:
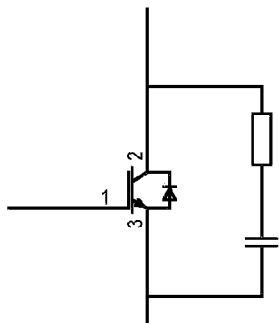
FIG. 9 shows a schematic circuit diagram of a circuit comprising a semiconductor transistor and an RC element connected between source and drain in a so-called RC snubber configuration.

FIG. 9 shows a schematic circuit diagram of a circuit comprising a semiconductor transistor and an RC element connected between source and drain in a so-called RC snubber configuration. Here a semiconductor transistor is coupled with its drain to a first terminal of a capacitor and with its source to a first terminal of a resistor. A second terminal of the resistor is then coupled to a second terminal of the capacitor. RC snubbers are known to be used to suppress a rapid rise in a voltage across a transistor.

Figure 10:
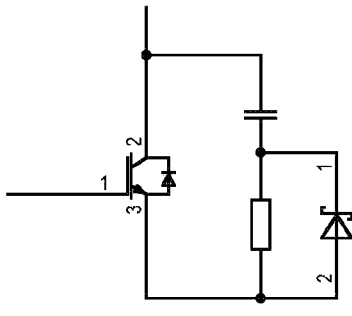
FIG. 10 shows a schematic circuit diagram of a circuit comprising a semiconductor transistor, an RC element connected between source and drain, and a parallel diode in a so-called RC snubber with discharge configuration.

FIG. 10 shows a schematic circuit diagram of a circuit comprising a semiconductor transistor, an RC element connected between source and drain, and a parallel diode in a so-called RC snubber with discharge configuration. Here, similar as with the embodiment of FIG. 9, a semiconductor transistor is coupled with its drain to a first terminal of a capacitor and with its source to a first terminal of a resistor. A second terminal of the resistor is then coupled to a second terminal of the capacitor. In addition a diode is coupled in parallel to the resistor. The capability of the capacitor to absorb a surge current is more effective than in the embodiment of FIG. 9 because the surge current flows through the diode.

Figure 11:
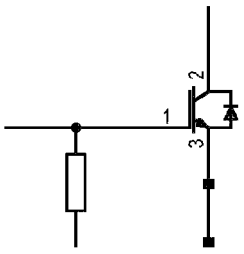
FIG. 11 shows a schematic circuit diagram of a circuit comprising a semiconductor transistor connected with a clamp resistor.

FIG. 11 shows a schematic circuit diagram of a circuit comprising a semiconductor transistor connected with a clamp resistor. As is well known in principle, by choosing an appropriate clamp resistor the switching behaviour of the transistor can be influenced in any desired manner.

Figure 12A:
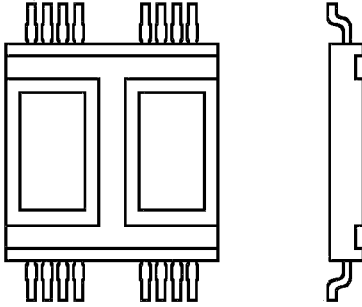
FIG. 12 comprises FIG. 12A to 12C and shows top and side view representations of an SMD TSC Non-Isolated semiconductor package (A), an SMD TSC Isolated semiconductor package, and an SMD BSC semiconductor package (C).
Figure 12B:
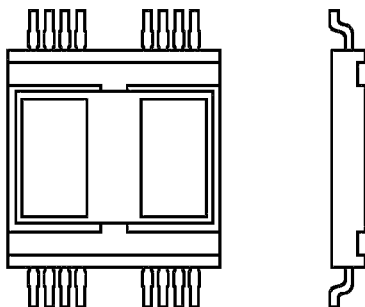
Figure 12C:
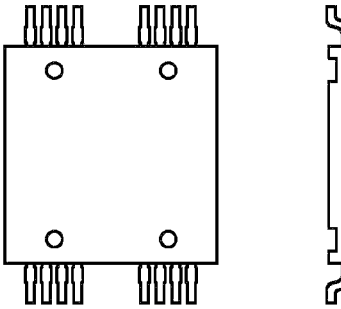

FIG. 12 comprises FIG. 12A to 12C and shows top and side view representations of an SMD TSC Non-Isolated semiconductor package (A), an SMD TSC Isolated semiconductor package, and an SMD BSC semiconductor package (C).

FIG. 12A shows top and side view representations of a semiconductor package in principle like the one shown and described above in connection with FIG. 1. The semiconductor package of FIG. 12A is configured in the form of a surface mount design top side cooling non-isolated semiconductor package comprising external gull-wing leads. The first or upper surfaces of the two semiconductor dies are not covered and exposed to the outside. This would allow mounting of a heatsink to the upper surface of the semiconductor package, the heat sink thus being in direct contact with the first or upper surfaces of the first and second semiconductor dies.

FIG. 12B shows top and side view representations of a semiconductor package in principle like the one shown and described above in connection with FIG. 1. The semiconductor package of FIG. 12B is configured in the form of a surface mount design top side cooling isolated semiconductor package comprising external gull-wing leads. The first or upper surfaces of the two semiconductor dies are covered by an electrically isolating but thermally conducting layer and are thus not exposed to the outside. This would also allow mounting of a heatsink to the upper surface of the semiconductor package, the heat sink thus not being in direct contact with the first or upper surfaces of the first and second semiconductor dies but effectively dissipating the heat through heat conduction through the electrically isolating layer.

FIG. 12C shows top and side view representations of a semiconductor package like the one shown and described above in connection with FIG. 1. The semiconductor package is configured in the form of a surface mount design bottom side cooling semiconductor package which means that the heat is dissipated through the die pad.

EXAMPLES

In the following specific examples of the present disclosure are described.

Example 1 is a semiconductor package comprising a package body, a first die pad at least partially encapsulated in the package body, the first die pad comprising a first main face and a second main face opposite to the first main face, a second die pad at least partially encapsulated in the package body, the second die pad comprising a first main face and a second main face opposite to the first main face, a first semiconductor die at least partially encapsulated in the package body and arranged on the first die pad, the first semiconductor die comprising a first contact pad) disposed on the first main face of the first semiconductor die and a second contact pad disposed on the second main face of the first semiconductor die, wherein the first semiconductor die is connected with the second contact pad to the first die pad, a further device at least partially encapsulated in the package body and arranged on the second die pad, the further device comprising a first contact pad disposed on the first main face of the further device and a second contact pad disposed on the second main face of the further device, wherein the further device is connected with the second contact pad to the second die pad, at least one first lead connected with the first contact pad of the first semiconductor die and extending out of the package body, at least one second lead connected with the second contact pad of the further device and extending out of the package body, and an electrical conductor connected between the at least one first lead and the at least one second lead, the electrical conductor being completely encapsulated in the package body.

Example 2 is the semiconductor package according to Example 1, further comprising a leadframe, wherein the first die pad, the second die pad, the at least one first lead, the at least one second lead, and the electrical connector are part of the leadframe.

Example 3 is the semiconductor package according to Example 1 or 2, further comprising a plurality of first leads connected with the first contact pad of the first semiconductor die and a plurality of second leads, wherein the electrical conductor is connected between at least one of the plurality of first leads and at least one of the plurality of second leads.

Example 4 is the semiconductor package according to Example 3, wherein the electrical conductor is connected between more than one of either the plurality of first leads or the plurality of second leads.

Example 5 is the semiconductor package of one of the preceding Examples, wherein a thickness of the electrical conductor is in a range from 100 μm to 1 mm.

Example 6 is the semiconductor package according to any one of the preceding Examples, wherein the first semiconductor die comprises a first semiconductor transistor die and the further device comprises a second semiconductor transistor die, wherein the first contact pad of the first semiconductor die is a source pad, and the second contact pad of the first semiconductor die is a drain pad, and the first contact pad of the second semiconductor die is a source pad, and the second contact pad of the second semiconductor die is a drain pad.

Example 7 is the semiconductor package according to any one of the preceding Examples, wherein the first semiconductor die comprises a first semiconductor transistor die and the further device comprises a second semiconductor transistor die, wherein the first contact pad of the first semiconductor die is a source pad, and the second contact pad of the first semiconductor die is a drain pad, and the first contact pad of the second semiconductor die is a drain pad, and the second contact pad of the second semiconductor die is a source pad.

Example 8 is the semiconductor package according to any one of the preceding Examples, wherein the first semiconductor die comprises a first semiconductor transistor die and the further device comprises a second semiconductor transistor die, wherein the first contact pad of the first semiconductor die is a drain pad, and the second contact pad of the first semiconductor die is a source pad, and the first contact pad of the second semiconductor die is a source pad, and the second contact pad of the second semiconductor die is a drain pad.

Example 9 is the semiconductor package according to any one of the preceding Examples, wherein the first semiconductor die comprises a first semiconductor transistor die and the further device comprises a second semiconductor transistor die, wherein the first contact pad of the first semiconductor die is a drain pad, and the second contact pad of the first semiconductor die is a source pad, and the first contact pad of the second semiconductor die is a drain pad, and the second contact pad of the second semiconductor die is a source pad.

Example 10 is the semiconductor package according to any one of the preceding Examples, wherein each of the first semiconductor die and the second semiconductor die comprises a power semiconductor transistor.

Example 11 is the semiconductor package according to any one of the preceding Examples, wherein the first semiconductor die comprises a first power transistor forming a low side switch of a half bridge circuit, and the further device comprises a second semiconductor die comprising a second power transistor connected in series with the first power transistor and forming a high side switch of the half bridge circuit.

Example 12 is the semiconductor package according to any one of Examples 1 to 5, wherein the first semiconductor die comprises a semiconductor diode and the further device comprises a second semiconductor die comprising a semiconductor diode.

Example 13 is the semiconductor package according to Example 12, wherein the first semiconductor die comprises a power transistor forming a part of a booster configuration, and the further device comprising a second semiconductor die comprising a power diode connected in series with the power transistor and forming a part of the booster configuration.

Example 14 is the semiconductor package according to Example 13, wherein the booster configuration comprises one or more of a PFC boost converter, a Hexa-DPAK PFC boost, or an Octa-DPAK PFC boost.

Example 15 is the semiconductor package according to any one of Examples 1 to 5, wherein the further device comprises one or more of a passive component, a resistor, a capacitor, and an RC element.

Example 16 is the semiconductor package according any one of the preceding Examples, wherein the second main face of the first die pad and the second main face of the further device are completely encapsulated in the package body.

Example 17 is the semiconductor package according to any one of the preceding Examples, wherein the second main face of the first die pad and the second main face of the further device are not fully encapsulated in the package body.

Example 18 is the semiconductor package according to any one of the preceding Examples, wherein the first main face of the first die pad and the first main face of the second die pad are at least partially uncovered by the package body.

Example 19 is the semiconductor package according to any one of Examples 6 to 9, further comprising at least one gate driver device disposed on one of leads connected with a gate of a semiconductor transistor die.

Example 20 is a leadframe, comprising a first die pad comprising a first main face and a second main face opposite to the first main face, a second die pad comprising a first main face and a second main face opposite to the first main face, at least one first lead, at least one second lead, and an electrical conductor connected between the at least one first lead and the at least one second lead.

Example 21 is the leadframe of Example 20, further comprising a plurality of first leads and a plurality of second leads, wherein the electrical conductor is connected between at least one of the plurality of first leads and at least one of the plurality of second leads.

Example 22 is the leadframe of Example 21, wherein the electrical conductor is connected between more than one of either the plurality of first leads or the plurality of second leads.

Example 23 is the leadframe of one of Examples 20 to 22, wherein a thickness of the electrical conductor is in a range from 100 µm to 1 mm.

It should be added that the above described embodiments can also be combined with advanced isolation concepts developed by the Applicant. In addition to the use of standard mold compounds, these concepts include the additional application of further thermally conductive, electrically insulating components such as insulation layers between the package or leadframe and a heat sink as well as the use of DCB (direct bonded copper), AMB (active metal braze) or IMS (insulated metal substrate) substrates.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor package, comprising:
a package body;
a first die pad at least partially encapsulated in the package body, the first die pad comprising a first die pad first main face and a first die pad second main face opposite to the first die pad first main face;

a second die pad at least partially encapsulated in the package body, the second die pad comprising a second die pad first main face and a second die pad second main face opposite to the second die pad first main face, where the second main face of the first die pad and the second main face of the second die pad are not fully encapsulated in the package body;
a first semiconductor die at least partially encapsulated in the package body and arranged on the first die pad, the first semiconductor die comprising a first contact pad disposed on a first main face of the first semiconductor die and a second contact pad disposed on a second main face of the first semiconductor die, wherein the first semiconductor die is connected with the second contact pad to the first die pad;
a further device at least partially encapsulated in the package body and arranged on the second die pad, the further device comprising a first contact pad disposed on a further device first main face and a second contact pad disposed on a further device second main face, wherein the further device is connected with the second contact pad to the second die pad;
at least one first lead connected with the first contact pad of the first semiconductor die and extending out of the package body;
at least one second lead connected with the second contact pad of the further device and extending out of the package body; and
an electrical conductor connected between the at least one first lead and the at least one second lead, the electrical conductor being completely encapsulated in the package body.

2. The semiconductor package of claim 1, further comprising a leadframe, wherein the first die pad, the second die pad, the at least one first lead, the at least one second lead, and the electrical connector are part of the leadframe.

3. The semiconductor package of claim 1, further comprising
a plurality of first leads connected with the first contact pad of the first semiconductor die and a plurality of second leads, wherein the electrical conductor is connected between at least one of the plurality of first leads and at least one of the plurality of second leads.

4. The semiconductor package of claim 3, wherein
the electrical conductor is connected between more than one of either the plurality of first leads or the plurality of second leads.

5. The semiconductor package of claim 1, wherein
the first semiconductor die comprises a first semiconductor transistor die and the further device comprises a second semiconductor transistor die, wherein
the first contact pad of the first semiconductor die is a source pad, and the second contact pad of the first semiconductor die is a drain pad, and
the first contact pad of the second semiconductor die is a source pad, and the second contact pad of the second semiconductor die is a drain pad.

6. The semiconductor package of claim 5, further comprising
at least one gate driver device disposed on one of leads connected with a gate of a semiconductor transistor die.

7. The semiconductor package of claim 1, wherein
the first semiconductor die comprises a first semiconductor transistor die and the further device comprises a second semiconductor transistor die, wherein the first contact pad of the first semiconductor die is a source pad, and the second contact pad of the first semiconductor die is a drain pad, and the first contact pad of the second semiconductor die is a drain pad, and the second contact pad of the second semiconductor die is a source pad.

8. The semiconductor package of claim 1, wherein the first semiconductor die comprises a first semiconductor transistor die and the further device comprises a second semiconductor transistor die, wherein the first contact pad of the first semiconductor die is a drain pad, and the second contact pad of the first semiconductor die is a source pad, and the first contact pad of the second semiconductor die is a source pad, and the second contact pad of the second semiconductor die is a drain pad.

9. The semiconductor package of claim 1, wherein the first semiconductor die comprises a first semiconductor transistor die and the further device comprises a second semiconductor transistor die, wherein the first contact pad of the first semiconductor die is a drain pad, and the second contact pad of the first semiconductor die is a source pad, and the first contact pad of the second semiconductor die is a drain pad, and the second contact pad of the second semiconductor die is a source pad.

10. The semiconductor package of claim 1, wherein each of the first semiconductor die and the second semiconductor die comprises a power semiconductor transistor.

11. The semiconductor package of claim 1, wherein:

the first semiconductor die comprises a first power transistor forming a low side switch of a half bridge circuit, and the further device comprises a second semiconductor die comprising a second power transistor connected in series with the first power transistor and forming a high side switch of the half bridge circuit.

12. The semiconductor package of claim 1, wherein the first semiconductor die comprises a semiconductor diode and the further device comprises a second semiconductor die comprising a semiconductor diode.

13. The semiconductor package of claim 12, wherein:

the first semiconductor die comprises a power transistor forming a part of a booster configuration, and the further device comprising a second semiconductor die comprising a power diode connected in series with the power transistor and forming a part of the booster configuration.

14. The semiconductor package of claim 13, wherein the booster configuration comprises one or more of a PFC boost converter, a Hexa-DPAK PFC boost, or an Octa-DPAK PFC boost.

15. The semiconductor package of claim 1, wherein the further device comprises one or more of a passive component, a resistor, a capacitor, and an RC element.

16. A semiconductor package, comprising:

a package body;

a first die pad at least partially encapsulated in the package body, the first die pad comprising a first die pad first main face and a first die pad second main face opposite to the first die pad first main face;

a second die pad at least partially encapsulated in the package body, the second die pad comprising a second die pad first main face and a second die pad second main face opposite to the second die pad first main face, where the second main face of the first die pad and the second main face of the second die pad are not fully encapsulated in the package body;

a first semiconductor die at least partially encapsulated in the package body and arranged on the first die pad, the first semiconductor die comprising a first contact pad disposed on a first main face of the first semiconductor die and a second contact pad disposed on a second main face of the first semiconductor die, wherein the first semiconductor die is connected with the second contact pad to the first die pad;

a further device at least partially encapsulated in the package body and arranged on the second die pad, the further device comprising a first contact pad disposed on a further device first main face and a second contact pad disposed on a further device second main face, wherein the further device is connected with the second contact pad to the second die pad;

at least one first lead connected with the first contact pad of the first semiconductor die and extending out of the package body;

at least one second lead connected with the second contact pad of the further device and extending out of the package body; and an electrical conductor connected between the at least one first lead and the at least one second lead, the electrical conductor being completely encapsulated in the package body, wherein a thickness of the electrical conductor is in a range from 100 μm to 1 mm.

17. A semiconductor package, comprising:

a package body;

a first die pad at least partially encapsulated in the package body, the first die pad comprising a first die pad first main face and a first die pad second main face opposite to the first die pad first main face;

a second die pad at least partially encapsulated in the package body, the second die pad comprising a second die pad first main face and a second die pad second main face opposite to the second die pad first main face, where the second main face of the first die pad and the second main face of the second die pad are not fully encapsulated in the package body;

a first semiconductor die at least partially encapsulated in the package body and arranged on the first die pad, the first semiconductor die comprising a first contact pad disposed on a first main face of the first semiconductor die and a second contact pad disposed on a second main face of the first semiconductor die, wherein the first semiconductor die is connected with the second contact pad to the first die pad;

a further device at least partially encapsulated in the package body and arranged on the second die pad, the further device comprising a first contact pad disposed on a further device first main face and a second contact pad disposed on a further device second main face, wherein the further device is connected with the second contact pad to the second die pad;

at least one first lead connected with the first contact pad of the first semiconductor die and extending out of the package body;

at least one second lead connected with the second contact pad of the further device and extending out of the package body; and an electrical conductor connected between the at least one first lead and the at least one second lead, the electrical conductor being completely encapsulated in the package body, wherein the first die pad first main face and the second die pad first main face are at least partially uncovered by the package body.

* * * * *